United States Patent [19]

Johnson et al.

[11] Patent Number: 4,495,377

[45] Date of Patent: Jan. 22, 1985

[54] SUBSTRATE WIRING PATTERNS FOR CONNECTING TO INTEGRATED-CIRCUIT CHIPS

[75] Inventors: Charles L. Johnson, Stewartville; John M. Ryba, Rochester, both of Minn.

[73] Assignee: International Business Machines Corporation, Armonk, N.Y.

[21] Appl. No.: 454,522

[22] Filed: Dec. 30, 1982

[51] Int. Cl.³ .............................................. H05K 1/02
[52] U.S. Cl. .................................. 174/68.5; 361/406; 361/409
[58] Field of Search ............... 174/68.5; 361/406, 409, 361/410

[56] References Cited

U.S. PATENT DOCUMENTS 3,716,761  2/1973  Rotast ........................... 174/68.5 X
3,833,838  9/1974  Christiansen ...................... 361/409
4,195,195  3/1980  Miranda et al. .................... 174/68.5

OTHER PUBLICATIONS

Milliken et al., Electrode Pattern, IBM Tech. Disc. Bull., V. 11 #7, Dec. 1968, p. 850.
Balyoz et al., Densified Wiring Channels Design Concept, IBM Tech. Disc. Bull., V. 17 #7, Dec. 1974, pp. 1958 and 1959.

Primary Examiner—R. R. Kucia
Attorney, Agent, or Firm—J. Michael Anglin

[57] ABSTRACT

An IC chip connects to a substrate by a pattern of pads arranged in single lines along the radial edges of segments of a polygon underlying the chip-linear conductors from the pads cross the outer edge of the segments in parallel groups. Wider power conductors can also be placed in the pattern.

16 Claims, 4 Drawing Figures

SUBSTRATE WIRING PATTERNS FOR CONNECTING TO INTEGRATED-CIRCUIT CHIPS

BACKGROUND OF THE INVENTION

The present invention relates to the mounting of integrated-circuit chips on a ceramic or other carrier substrate, and more specifically concerns the physical layout of conductors on the substrate for connecting the chips to each other and to other components.

One conventional technique for connecting integrated-circuit (IC) chips to each other and to other components is to mount them on a ceramic substrate having a pattern of conductors deposited on its surface. These conductors are substantially linear, and terminate in an array of small round pads under the chip. The chip carries a mating array of small projections called solder bumps or C4 (controlled-collapse chip connection) contacts. The chip is bonded to the substrate by applying a flux to the pads, aligning the C4 contacts over the mating pads, and applying sufficient heat to reflow the solder onto the pads, thus forming both a mechanical bond and an electrical contact between each pad and its mating contact.

One of the major barriers to increasing the amount of function which can be integrated in microelectronics technology is the number of off-chip connections which can be brought into a single chip. The ultimate restriction is the maximum escape number for a given minimum conductor pitch and chip size. If a circle is drawn around a neutral point at or near the center of the chip, the length of its circumference divided by the pitch or distance between adjacent conductors gives an approximate value for the maximum escape number. The radius of this circle ("distance from neutral point" or DNP) can be as large as the chip itself, although there are reasons for keeping the DNP smaller. For example, differential thermal expansion between the chip and the substrate stresses the contacts in proportion to the DNP; this is a major factor in the reliability of microelectronic circuits. The actual escape number is limited to less than its maximum value by another factor. The pads terminating each conductor are larger in width than the conductors, and therefore require a larger pitch or spacing, usually about three to four times the conductor pitch. If the pads are merely arranged in a circle at the DNP, the actual escape number is limited by the larger pad pitch. To improve this situation, the pads must use more of the area under the chip, within the DNP circle.

The prior art has developed many wiring patterns for mounting an integrated-circuit chip on a substrate with C4 contacts. The simplest configuration or footprint is a completely filled square or rectangular array of solder bumps and mating circular pads on the substrate. The problem here, however, is that the conductors must snake between the pads to escape from under the chip. This decreases the realizable pad pitch by appropriating some of it for the conductors. The most common expedient is a partially depopulated array. For example, a number of pads in a central region of the chip can be omitted; in the extreme case, this would leave only a single line of pads in a square near the chip edges and inscribed in the DNP circle. Some of the pads can alternatively be omitted on the periphery of the array, giving it a puckered or scalloped shape.

All of the prior approaches fall short of attaining the maximum escape number for a given maximum DNP. Moreover, many prior attempts are of an ad-hoc nature, without any overall strategy which could be employed to guide the design of wiring configurations for a large number of different chips. The major single drawback of conventional wiring patterns for the pads and conductors is that they require conductors to pass between pads. As previously stated, such patterns always decrease the pitch of the pads, forcing them to occupy a larger overall area than necessary. In addition, they generally force the conductors into contorted paths through the thicket of pads; this greatly increases the design effort and also degrades the current-carrying capability of the conductors by increasing their length to the DNP circle or boundary.

SUMMARY OF THE INVENTION

The present invention provides a family of improved wiring patterns of pads and conductors for an IC substrate. The escape number actually realized is close to the maximum escape number possible for a given conductor pitch and DNP. The patterns are regular, general, and easily adaptable to a wide range of specific situations without excessive design effort. They do not require conductors to pass between adjacent pads, so that the pads can be spaced at their own minimum pitch.

Broadly speaking, the invention comprises a substrate for mounting at least one IC chip and carrying a pattern of input/output pads and linear conductors. A polygon approximating the DNP circle is divided into a number of wedge-shaped segments each having radial edges and an outer edge. The I/O pads are placed in single lines substantially following the radial edges. The conductors run from the pads in substantially straight and parallel paths crossing the outer edge.

Additional connections can be made for power or other purposes with further pads and with conductors wider than the signal conductors, without noticeably interfering with the foregoing wiring pattern.

BRIEF DESCRIPTION OF THE DRAWINGS

FIG. 1 is a top view of the surface of a conventional ceramic substrate or base 10. Light solid line 11 indicates the outline of a semiconductor chip on the substrate. Small circles such as 12 represent I/O or signal pads for contacting conventional solder bumps or controlled-collapse (C4) contacts on the chip. Heavy lines such as 13 show conductors or lands in a wiring pattern for connecting pads 12 to other components on the substrate, including other chips and external pins (not shown). The pads and conductors can be deposited or formed on the substrate in any conventional manner.

Pads 12 lie inside a polygonal area or footprint 14 below chip 11. The polygon may be considered to approximate the DNP circle; it is centered at a neutral point 141, located preferably at or near the center of the chip. Area 14 is conceptually divided into a number of wedge-shaped segments such as 15. Each segment has two radial edges 151, 152 and an outer edge 153. The length of the radial edges is approximately the maximum DNP of any contact. Pads 12 are disposed in single lines substantially following the radial edges of the segments. In this particular example, the lines are not quite parallel to the radial edges, yet not quite radial themselves from the neutral point. The pad spacing or pitch 121 is preferably uniform; for current fabrication technology, 228 microns is a representative number. FIG. 1 shows eight identical segments each having a 45-degree central angle, but other numbers are also useful. Conductors 13 run from pads 12 to destinations across outer segment edges 153. Although they may jog or turn in connecting to the pads, they preferably cross each boundary 153 perpendicularly and at a constant pitch 131; this configuration allows a greater total number of conductors to leave the area under the chip—that is, a greater escape number. The pad pitch is about 3.2 times the conductor pitch in this example. Since the conductors run at an angle to the lines of pads, there is no necessity for any conductors to pass between any pads. This allows the pads to be spaced at the minimum pitch determined by their required diameter, without any gaps. At the same time, the conductors can all be spaced at their minimum pitch. In this example, the minimum conductor pitch is about 71 microns. The conductors run in substantially straight and direct lines, thus decreasing their total resistance, or, equivalently, allowing them to be thinner and more closely spaced to achieve a greater total number; this characteristic also eases design and layout of the conductors. A large percentage (about 70% in this example) of each segment's outer edge can actually be used for conductor escape.

The total number of segments can vary. Fewer than four segments will usually not be advantageous, nor will more than about twelve. That is, the central angle formed by the radial edges of a segment is between about 90 degrees and about 30 degrees. The optimum number of segments is a function of the pad pitch, the conductor pitch, and the DNP.

Figure 1:
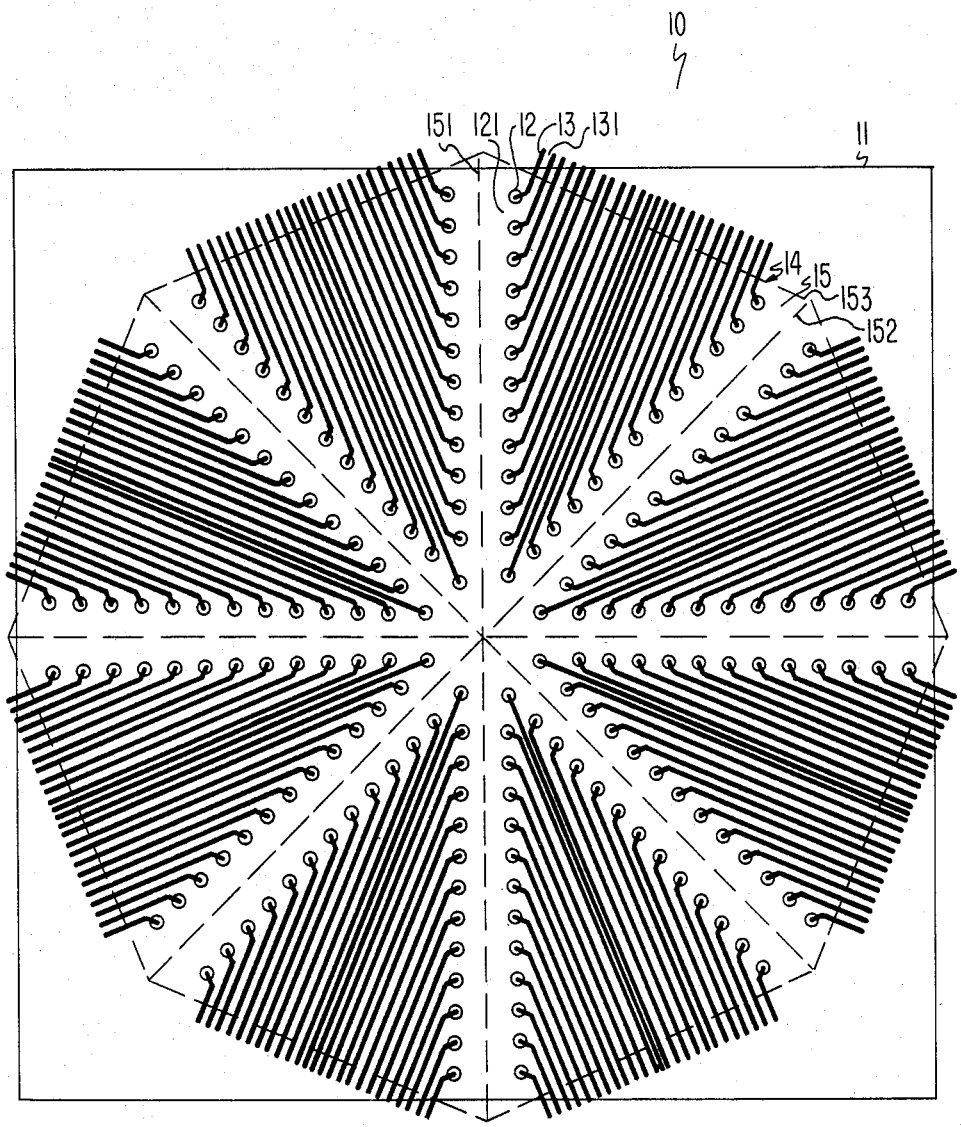
FIG. 1 is a top view of a conventional ceramic substrate having formed thereon a pattern of contacts and conductors according to the invention for connection to a semiconductor chip.
Figure 2:
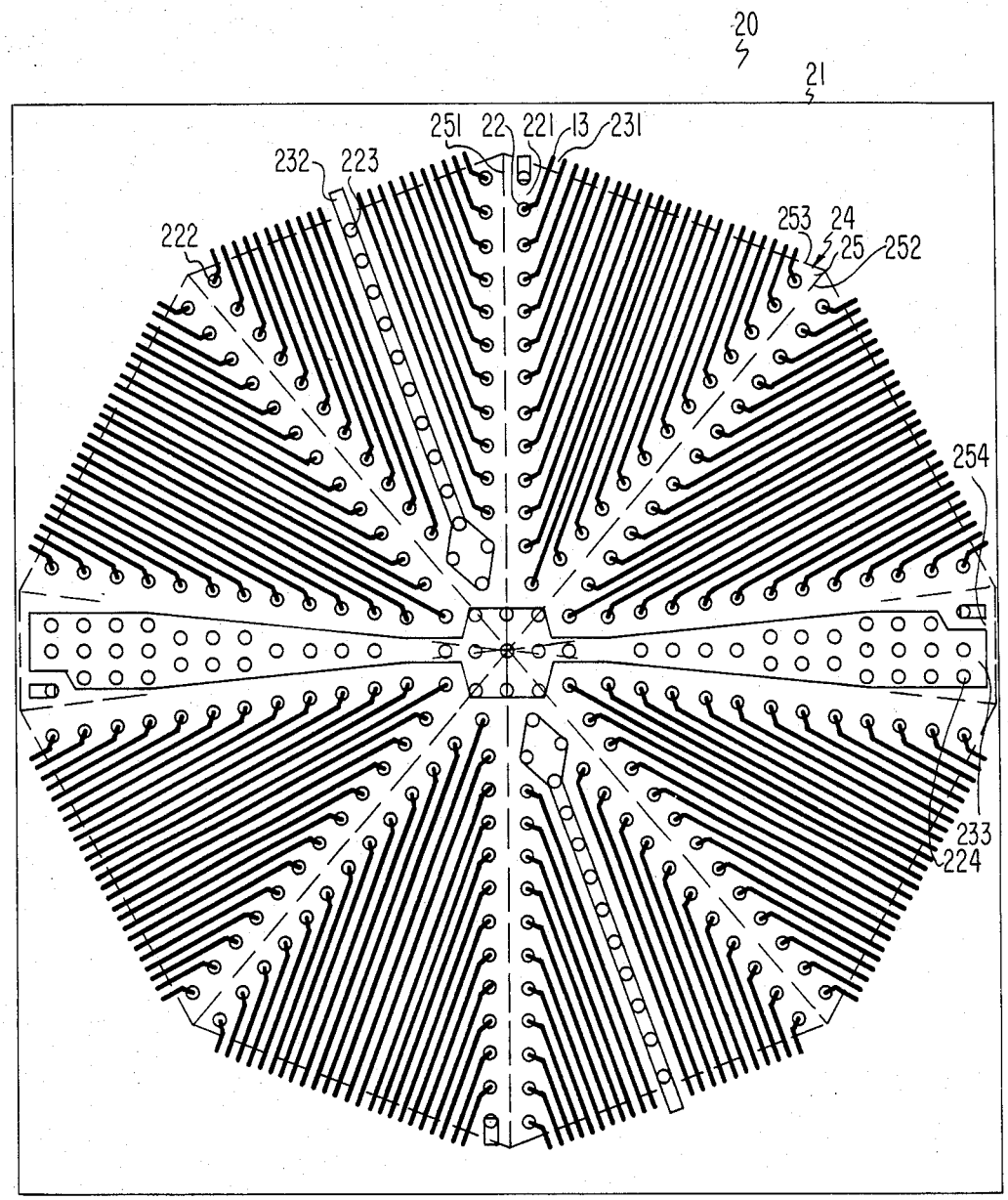
FIGS. 2–4 show substrates having other patterns according to the invention.

FIG. 2 illustrates another substrate 20 and chip 21. Here, the pads 22 form two groups; the signal I/O pads such as 222 need only one conductor per pad because of their low current levels, but power supply connections frequently require multiple pads such as 223. The conductors for power connections, such as at 232, are preferably wider than those for signals, also because of the increased current. This power connection lies within a segment containing signal connections as well. Power conductor 233 (which could be, e.g., a ground line) occupies two entire segments such as 254 and a central region of polygon 24. Since all pads 224 in these segments go to the same conductor, there is no need to arrange them in any specific pattern for the sake of wireability. The power-connection segments are generally smaller than those containing mostly or entirely signal connections. That is, the segments need not be all the same size nor have the same central angle between their two radial edges.

Figure 3:
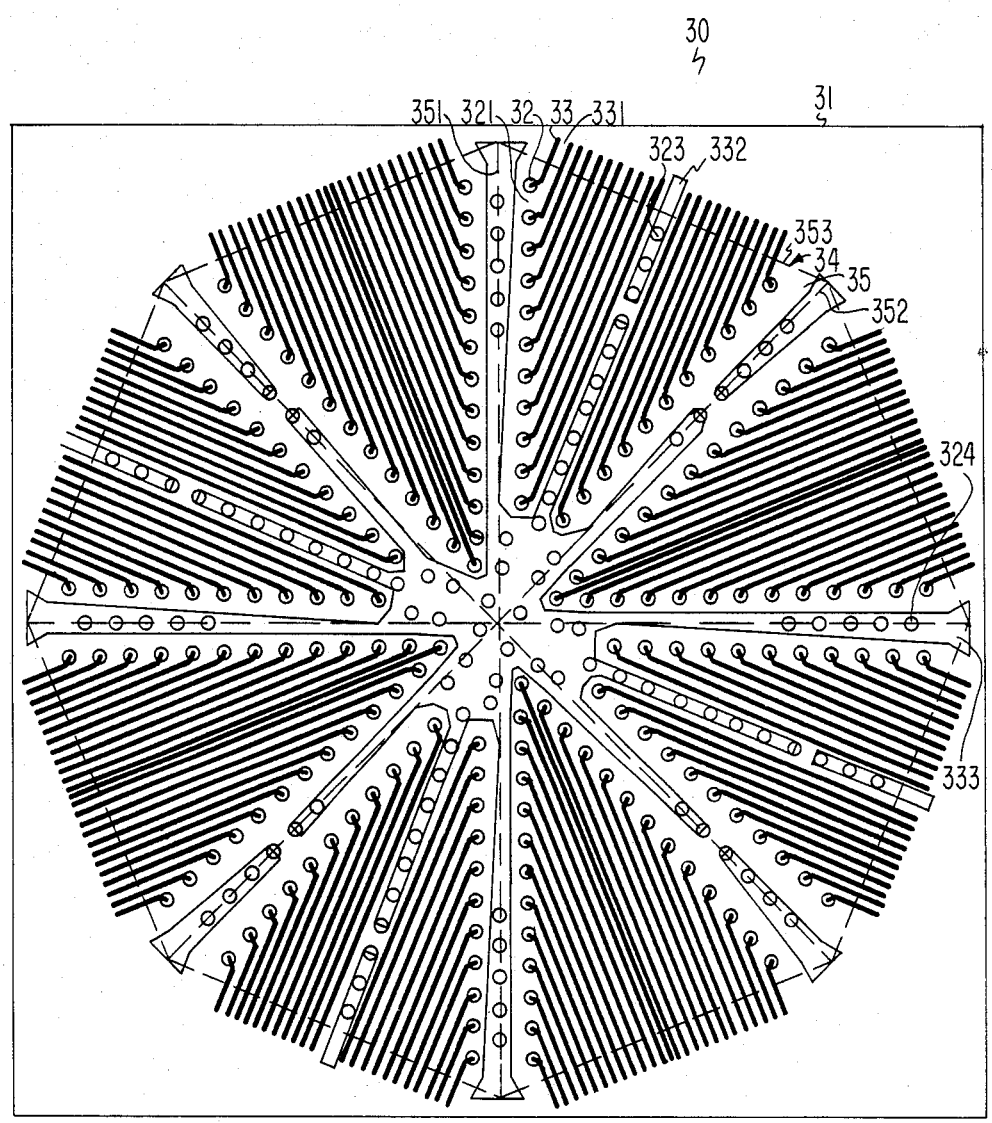

FIG. 3 is a further useful wiring pattern for a substrate 30 and chip 31. Ground conductor 333, instead of occupying its own segment, uses a single line of pads 324 lying on the radial edge between two adjacent segments. Conductor 333 also has processes from the central region of polygon 35 into several lines of intra-segment power pads of the type described for FIG. 2. The outer pads 323 in these lines couple to other power conductors 332 which escape across edges 353. Ground conductor 333 additionally extends part way up some of the inter-segment lines of pads in the same manner. Large, complex ground conductors prevent unacceptable voltage drops and ground noise in very large or very dense chips.

Figure 4:
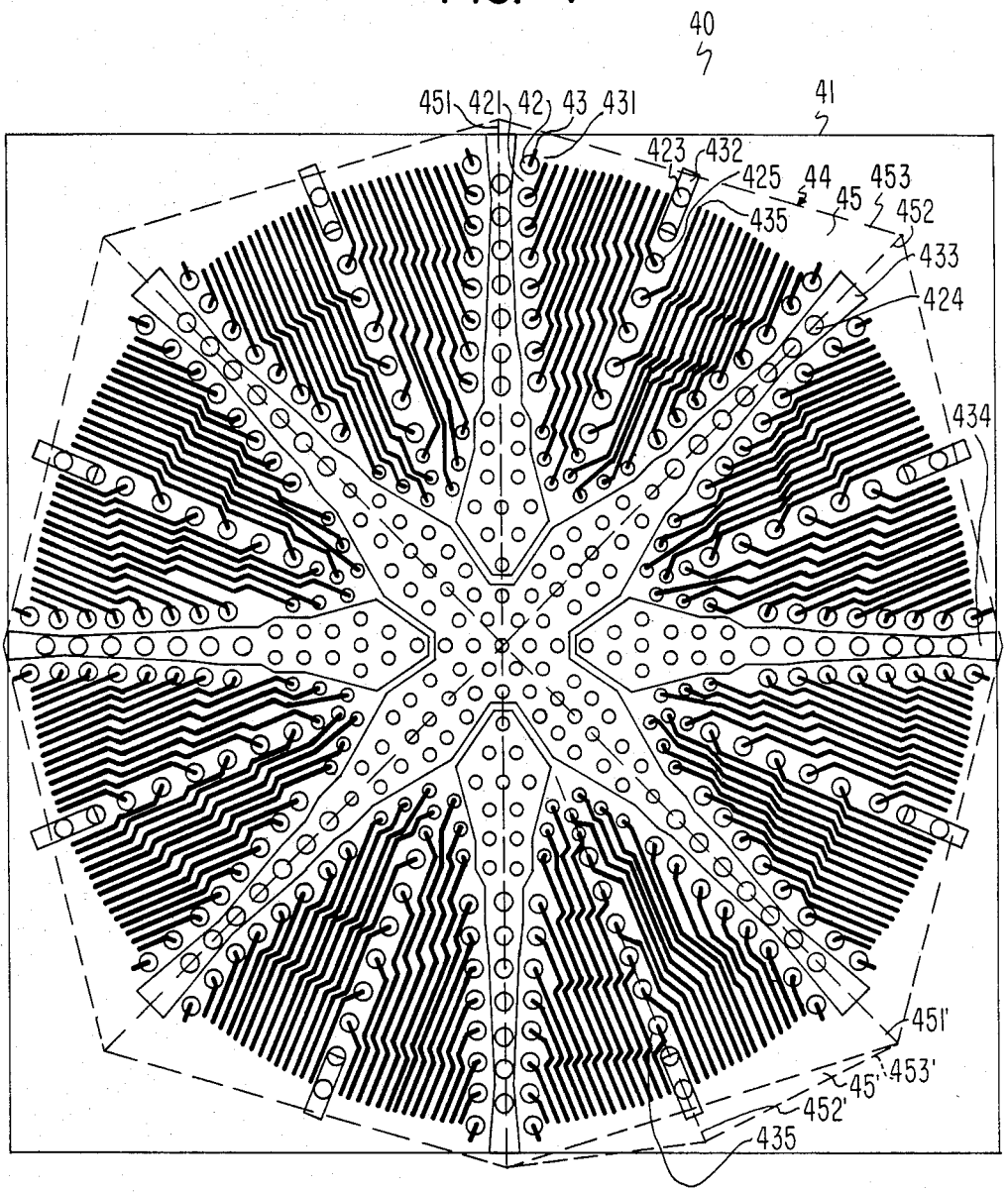

FIG. 4 shows yet another wiring configuration for a chip 41 mounted on substrate 40. Multiple inter-segment power conductors such as 433 and 434 couple to power pads 424 extending in multiple lines at least partway along the radial edges 451, 452 of each segment 45. Thus, although signal pads 42 still lie in single diverging lines along the radial edges, those lines are not necessarily straight.

Likewise, slight variations in the pitch of the signal pads and jogs in the signal conductors can increase the overall escape number in cases such as this. Intra-segment power pads and conductors 423, 432 are partially replaced by additional signal pads and I/O conductors. That is, other signal pads, beyond those in the single lines at the segment radial edges, can be placed within the segment without unduly interfering with the signal conductors from the radial-edge pads. Alternatively, the configuration of FIG. 4 can be viewed as having sixteen segments instead of eight; the dotted lines near the bottom of FIG. 4 outline wedge-shaped segments 45', each having radial edges 451', 452' and outer edge 453'. The signal pads 435 along edge 452' can be considered to be split between the two segments, half of them forming a single line of signal pads belonging to one segment, the other half forming another (collinear) single line of signal pads for the other segment. The lines formed by the signal pads need not, of course, extend for the entire length of the radial edge. Note that, although such smaller segments are all the same size, they are not the same shape, half of them being substantially allochiral to the others.

Some representative numbers give an idea of the quantitative improvement offered by the present invention. The table below shows the DNP in microns, the number of I/O pads, and the efficiency, in number of pads (or conductors) per micron of circumference at the DNP boundary. Quantities are given for single and double rows of pads in a hollow square following the chip edges, for full and partially depopulated square pad arrays, and for three examples according to the present invention.

| Pad configuration | DNP | Pads | Efficiency |
| --- | --- | --- | --- |
| Peripheral | | | |
| Single Row | 4112 | 68 | 10.7 |
| Double Row | 2171 | 68 | 20.3 |
| Array | | | |
| Filled | 2827 | 94 | 21.3 |
| Depopulated | 2212 | 96 | 27.9 |
| Radial | | | |
| Example 1 | 1626 | 96 | 38.1 |
| Example 2 | 2210 | 144 | 42.2 |
| Example 3 | 2794 | 192 | 44.5 |

Note that, for example, the depopulated array above requires 36% more DNP radius than the radial pattern to achieve 96 contacts, and that the 192-pad radial pattern has twice as many contacts as the depopulated array, in 20% less radius, so that the radial pattern is 60% more efficient.

Modifications to the above embodiments of the invention will be obvious to those skilled in the art. Likewise, other advantages of the invention appear from the above description. A few of these additional advantages are as follows. The wedge-shaped segments of the invention can accomodate a larger total number of chip contacts merely by radially extending the pad lines, without any other design effort. In fact, such radial extension increases the percentage of the DNP circumference which can be used for conductor escape; this is the reverse of filled pad arrays, where size increase makes it more and more difficult to snake through the more central pads to the periphery. The radial configuration of pads cuts down on chip alignment problems during manufacture. Surface tension of the solder during the reflow bonding process tends to self-align the C4 contacts to the pads when the chip is placed on the substrate; the greater angular spacing of the inventive radial pad configuration tolerates a larger rotational error in chip placement. A corrosion inhibitor is conventionally squirted between chip and substrate after assembly; the present pad pattern provides channels for better penetration toward the center of the chip; this has always been a problem with filled and depopulated pad arrays.

We claim as our invention:

1. A substrate for mounting an integrated-circuit chip by means of linear signal conductors connecting to a plurality of input-output pads on said substrate, characterized in that
    said pads are disposed in single lines substantially following the radial edges of a plurality of wedge-shaped segments, said linear conductors crossing the outer edges of said segment, said segments together forming a polygonal area under said chip.

2. A substrate according to claim 1, wherein said conductors cross said outer edges at a substantially constant pitch.

3. A substrate according to claim 2, wherein said pads are disposed at a substantially constant pitch in said single lines.

4. A substrate according to claim 3, wherein the pitch of said conductors is less than the pitch of said pads.

5. A substrate according to claim 3, wherein said conductors cross said outer edges substantially perpendicularly thereto.

6. A substrate according to claim 1, wherein said single lines are substantially straight.

7. A substrate according to claim 1, wherein the angle between the radial edges of at least some of said segments is substantially less than 90 degrees.

8. A substrate according to claim 1, wherein said substrate includes sets of further pads and a plurality of further conductors each coupled to one of said sets of further pads.

9. A substrate according to claim 8, wherein at least some of said further conductors are substantially wider than said signal conductors.

10. A substrate according to claim 8, wherein at least some of said further conductors lie between adjacent ones of said segments.

11. A substrate according to claim 8, wherein at least some of said further conductors extend substantially radially within said segments.

12. A substrate according to claim 1, wherein said signal conductors are all coplanar.

13. A substrate according to claim 12, wherein said further conductors are coplanar with said signal conductors.

14. Means for mounting an integrated-circuit chip, comprising:
    a substrate;
    a plurality of input-output pads disposed in a polygonal area on said substrate, said area comprising a plurality of segments each having two substantially radial edges and an outer edge, said pads lying in single lines within a plurality of said segments along each radial edge of said plurality of segments; and
    a plurality of linear signal conductors on said substrate extending between said pads and each outer edge of said plurality of segments, said conductors being spaced closer to each other at said each outer edge than the spacing between said pads along each said radial edge.

15. Means according to claim 14, wherein substantially all of said conductors lie on the surface of said substrate.

16. Means according to claim 14, further comprising:
    a plurality of further pads lying within said polygonal area; and
    a plurality of further conductors wider than said signal conductors and connected to said further pads.

* * * * *